United States Patent
Chang et al.

(10) Patent No.: US 11,984,385 B2
(45) Date of Patent: May 14, 2024

(54) LEAD FRAME STRUCTURE AND MANUFACTURING METHOD THEREOF

(71) Applicant: Jentech Precision Industrial Co., LTD., Taoyuan (TW)

(72) Inventors: Jian-Tsai Chang, Taoyuan (TW);
Chin-Jui Yu, Taoyuan (TW);
Chun-Hsiung Wang, Taoyuan (TW);
Wei-Chi Lin, Taoyuan (TW)

(73) Assignee: Jentech Precision Industrial Co., LTD., Taoyuan (TW)

(*) Notice: Subject to any disclaimer, the term of this patent is extended or adjusted under 35 U.S.C. 154(b) by 426 days.

(21) Appl. No.: 17/230,950

(22) Filed: Apr. 14, 2021

(65) Prior Publication Data
US 2022/0254705 A1 Aug. 11, 2022

(30) Foreign Application Priority Data
Feb. 8, 2021 (TW) ................................ 110104828

(51) Int. Cl.
*H01L 33/62* (2010.01)
*H01L 21/768* (2006.01)
*H01L 23/495* (2006.01)

(52) U.S. Cl.
CPC ...... *H01L 23/49541* (2013.01); *H01L 21/768* (2013.01); *H01L 23/49575* (2013.01); *H01L 33/62* (2013.01)

(58) Field of Classification Search
CPC ............. H01L 23/49541; H01L 21/768; H01L 23/49575; H01L 33/54; H01L 33/56; H01L 33/62; H01L 33/58; H01L 33/60; H01L 2933/0033; H01L 33/486; H01L 23/49548; H01L 2224/48247; H01L 2224/48257; H01L 2224/48091; H01L 2933/0058; H01L 2933/0066; H01L 2933/005

(Continued)

(56) References Cited

U.S. PATENT DOCUMENTS 8,716,730 B2 * 5/2014 Wang .................... H01L 33/486
257/773
8,946,875 B2 * 2/2015 Kelkar .................... H01L 23/10
257/730

(Continued)

FOREIGN PATENT DOCUMENTS

CN 101507004 B * 4/2011 ......... B29C 45/0025
CN 203026354 U 6/2013

(Continued)

*Primary Examiner* — Samuel Park
(74) *Attorney, Agent, or Firm* — CKC & Partners Co., LLC

(57) ABSTRACT

The present disclosure is related to a lead frame structure. The lead frame structure includes a bottom board and a blocking wall. The bottom board has a first conductive portion and a second conductive portion. The first conductive portion separates from the second conductive portion. The first and second conductive portions are configured to electrically connect to a light source. The blocking wall is located on the bottom board, and the blocking wall surrounds an opening. The first and the second conductive portions are exposed from the opening. The first and the second conductive portions each have an extending portion. The extending portion extends beyond an external surface of the blocking wall in a horizontal direction.

7 Claims, 9 Drawing Sheets

(58) Field of Classification Search
USPC ........... 257/81, 98, 666, 676, 668, 730, 773,
257/23.056, 23.066, 23.141, 33.001,
257/33.066
See application file for complete search history.

(56) References Cited

U.S. PATENT DOCUMENTS

| | | | |
|---|---|---|---|
| 10,505,090 B2 * | 12/2019 | Fukuda | ................. H01L 33/486 |
| 2006/0001055 A1 * | 1/2006 | Ueno | ...................... H01L 33/60 |
| | | | 257/E33.071 |
| 2013/0187260 A1 | 7/2013 | Kelkar et al. | |
| 2013/0299854 A1 * | 11/2013 | Lee | ......................... H01L 33/62 |
| | | | 257/88 |
| 2014/0306257 A1 * | 10/2014 | Lee | ......................... H01L 33/62 |
| | | | 257/98 |
| 2017/0040516 A1 * | 2/2017 | Fukuda | ................. H01L 33/486 |
| 2017/0271249 A1 * | 9/2017 | Kasuya | ............... H01L 21/4842 |
| 2018/0204990 A1 * | 7/2018 | Fukuda | ................. H01L 33/486 |
| 2018/0212118 A1 | 7/2018 | Chen et al. | |
| 2018/0254394 A1 * | 9/2018 | Sasaoka | ............... H01L 25/0753 |
| 2018/0301600 A1 * | 10/2018 | Ichikawa | ................ H01L 33/62 |

FOREIGN PATENT DOCUMENTS

| | | | | | |
|---|---|---|---|---|---|
| JP | 4572312 B2 | * | 11/2010 | ........... | H01L 33/486 |
| JP | 2011-507228 A | | 3/2011 | | |
| JP | 2012-028699 A | | 2/2012 | | |
| JP | 2012028699 A | * | 2/2012 | ........... | H01L 23/047 |
| JP | 2012231068 A | * | 11/2012 | ............. | H01L 24/97 |
| JP | 2015-177151 A | | 10/2015 | | |
| JP | 5834467 B2 | * | 12/2015 | | |
| JP | 2017-107965 A | | 6/2017 | | |
| JP | 2017-183620 A | | 10/2017 | | |
| JP | 7228063 B2 | * | 2/2023 | ......... | H01L 21/4842 |
| KR | 10-2007-0105630 A | | 10/2007 | | |
| TW | 200705716 A | | 2/2007 | | |
| TW | 201616697 A | | 5/2016 | | |
| WO | 2008/081696 A1 | | 7/2008 | | |

* cited by examiner

LEAD FRAME STRUCTURE AND MANUFACTURING METHOD THEREOF

RELATED APPLICATION

This application claims priority to Taiwan Application Serial Number 110104828, filed Feb. 8, 2021, which is herein incorporated by reference in its entirety.

BACKGROUND

Field of Invention

The present disclosure relates to a lead frame structure and a manufacturing method of the lead frame structure.

Description of Related Art

In general, a lead frame structure used for light-emitting diodes (LED) may include an electrode and a blocking wall on the electrode. When a LED is disposed on the electrode, the blocking wall may surround the LED. The blocking wall may be formed by a material that includes epoxy resin. While manufacturing the aforementioned lead frame structure, due to horizontal cutting and vertical cutting, a lateral surface of the electrode of the lead frame structure is usually flush with a lateral surface of the epoxy resin thereon, so that the lateral surface of the lead frame is flat. Moreover, when assembling the lead frame structure and a circuit board, the lead frame structure below may be pasted by a bonding layer. The bonding layer is located between the lead frame structure and the circuit board to stable the lead frame structure onto the circuit board. However, when the bonding layer is sandwiched between the lead frame structure and the circuit board, an inspector may not observe the bonding layer under the lead frame structure, therefore the inspector may not figure out whether the bonding layer is uniformly pasted between the lead frame structure and the circuit board, which leads to some defects in the lead frame structure during a packaging process and to reduce a yield of the lead frame structure.

SUMMARY

An aspect of the present disclosure is related to a lead frame structure.

According to an embodiment of the present disclosure, a lead frame structure includes a bottom board and a blocking wall. The bottom board has a first conductive portion and a second conductive portion. The first conductive portion separates from the second conductive portion. The first and second conductive portions are configured to electrically connect to a light source. The blocking wall is located on the bottom board, and the blocking wall surrounds an opening. The first and the second conductive portions are exposed from the opening. The first and the second conductive portions each have an extending portion. The extending portion extends beyond an external surface of the blocking wall in a horizontal direction.

In an embodiment of the present disclosure, the bottom board has an insulated portion, and the insulated portion is located between the first conductive portion and the second conductive portion.

In an embodiment of the present disclosure, the extending portions of the first conductive portion and the second conductive portion each have a lateral surface facing away from the blocking wall, and the lateral surfaces of the extending portions each have a concave portion.

In an embodiment of the present disclosure, the extending portions of the first conductive portion and the second conductive portion each have a lateral surface facing away from the blocking wall, and the lateral surfaces of the extending portions each have a protruding portion.

In an embodiment of the present disclosure, the extending portions of the first conductive portion and the second conductive portion each have a lateral surface facing away from the blocking wall, and the lateral surfaces of the extending portions are flat.

In an embodiment of the present disclosure, a bottom surface of the extending portion of the first conductive portion and a bottom surface of the extending portion of the second conductive portion are configured to be pasted by a bonding layer.

In an embodiment of the present disclosure, a bottom surface of the extending portion of the first conductive portion and a bottom surface of the extending portion of the second conductive portion each have a concave portion.

In an embodiment of the present disclosure, the concave portion of the bottom surface of the extending portion of the first conductive portion and the concave portion of the bottom surface of the extending portion of the second conductive portion are configured to be pasted by a bonding layer.

In an embodiment of the present disclosure, the bottom board further has a third conductive portion, and the insulated portion extends between the second conductive portion and the third conductive portion, and the third conductive portion has an extending portion, the extending portion of the third conductive portion extends beyond the external surface of the blocking wall in the horizontal direction.

In an embodiment of the present disclosure, the bottom board further has a fourth conductive portion, and the insulated portion extends between the first conductive portion and the fourth conductive portion, and the fourth conductive portion has an extending portion, the extending portion of the fourth conductive portion extends beyond the external surface of the blocking wall in the horizontal direction.

An aspect of the present disclosure is related to a manufacturing method of a lead frame structure.

According to an embodiment of the present disclosure, a manufacturing method of a lead frame structure includes: forming a bottom board with a first conductive portion and a second conductive portion, wherein the first conductive portion separates from the second conductive portion, and the first and the second conductive portions each have an extending portion; and forming a blocking wall on the bottom board by a mold shielding the extending portions such that the extending portions extend beyond an external surface of the blocking wall in a horizontal direction, wherein the blocking wall surrounds an opening, and the first conductive portion and the second conductive portion are exposed from the opening.

In an embodiment of the present disclosure, the manufacturing method of the lead frame structure further includes etching a bottom surface of the extending portion of the first conductive portion and a bottom surface of the extending portion of the second conductive portion such that the bottom surface of the extending portion of the first conductive portion and the bottom surface of the extending portion of the second conductive portion each have a concave portion.

In the embodiments of the present disclosure, due to the first conductive portion and the second conductive portion of the lead frame structure have the extending portions, and the extending portions of the first and the second conductive portions extend beyond the external surface of the blocking wall thereon in the horizontal direction, after the bonding layer is pasted under the lead frame structure and bonded to the circuit board, the squeezed bonding layer may overflow from the extending portions such that the bonding layer is easier to be observed. As a result, an inspector may observe the bonding layer located at the extending portions to ensure that the bonding layer is uniformly filled under the lead frame structure, so as to reduce defect of the lead frame structure and improve a yield of the lead frame structure, such that the lead frame structure may be applicable in the subsequent packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
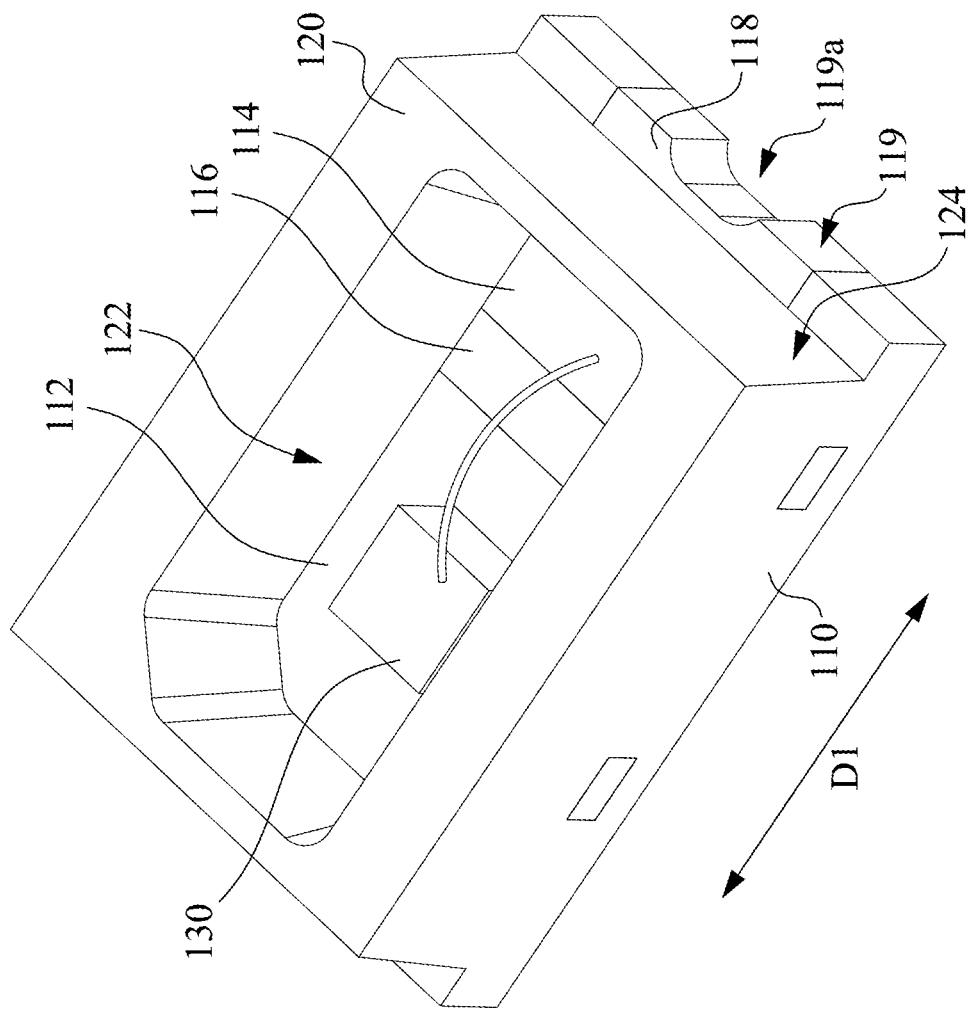
FIG. 1 illustrates a stereoscopic view of a lead frame structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stereoscopic view of a lead frame structure 100 according to one embodiment of the present disclosure. Referring to FIG. 1, the lead frame structure 100 includes a bottom board 110 and a blocking wall 120. The bottom board 110 of the lead frame structure 100 has a first conductive portion 112 and a second conductive portion 114. The first conductive portion 112 of the bottom board 110 separates from the second conductive portion 114. The first conductive portion 112 and the second conductive portion 114 of the bottom board 110 are configured to electrically connect to a light source 130. For example, the light source 130 may be a light-emitting diode, and a bottom surface (e.g., positive) of the light source 130 electrically connects to the first conductive portion 112, and a top surface (e.g., negative) electrically connects to the second conductive portion 114 by a wire. The blocking wall 120 of the lead frame structure 100 is located on the bottom board 110, and the blocking wall 120 surrounds an opening 122. The opening 122 of the blocking wall 120 surrounds the light source 130 to shade or reflect the light. The first conductive portion 112 and the second conductive portion 114 of the bottom board 110 are exposed from the opening 122 of the blocking wall 120. The first conductive portion 112 and the second conductive portion 114 of the bottom board 110 each have an extending portion 118. The extending portions 118 of the first conductive portion 112 and the second conductive portion 114 extend beyond an external surface 124 of the blocking wall 120 in a horizontal direction D1. In some embodiments, the blocking wall 120 of the lead frame structure 100 may be made of a material that includes epoxy resin and made by molding.

In some embodiments, the extending portions 118 of the first conductive portion 112 and the second conductive portion 114 have a lateral surface 119 facing away from the blocking wall 120. And, the lateral surfaces 119 of the extending portions 118 of the first conductive portion 112 and the second conductive portion 114 have a concave portion 119a. For example, the concave portion 119a of the extending portion 118 may be located in the middle of the lateral surface 119 of the extending portion 118. Moreover, the bottom board 110 of the lead frame structure 100 has an insulated portion 116. The insulated portion 116 of the bottom board 110 is located between the first conductive portion 112 and the second conductive portion 114 of the bottom board 110, so as to separate the first conductive portion 112 and the second conductive portion 114 and to avoid a short circuit. Also, the insulated portion 116 of the bottom board 110 is exposed from the opening 122 surrounded by the blocking wall 120.

Figure 2:
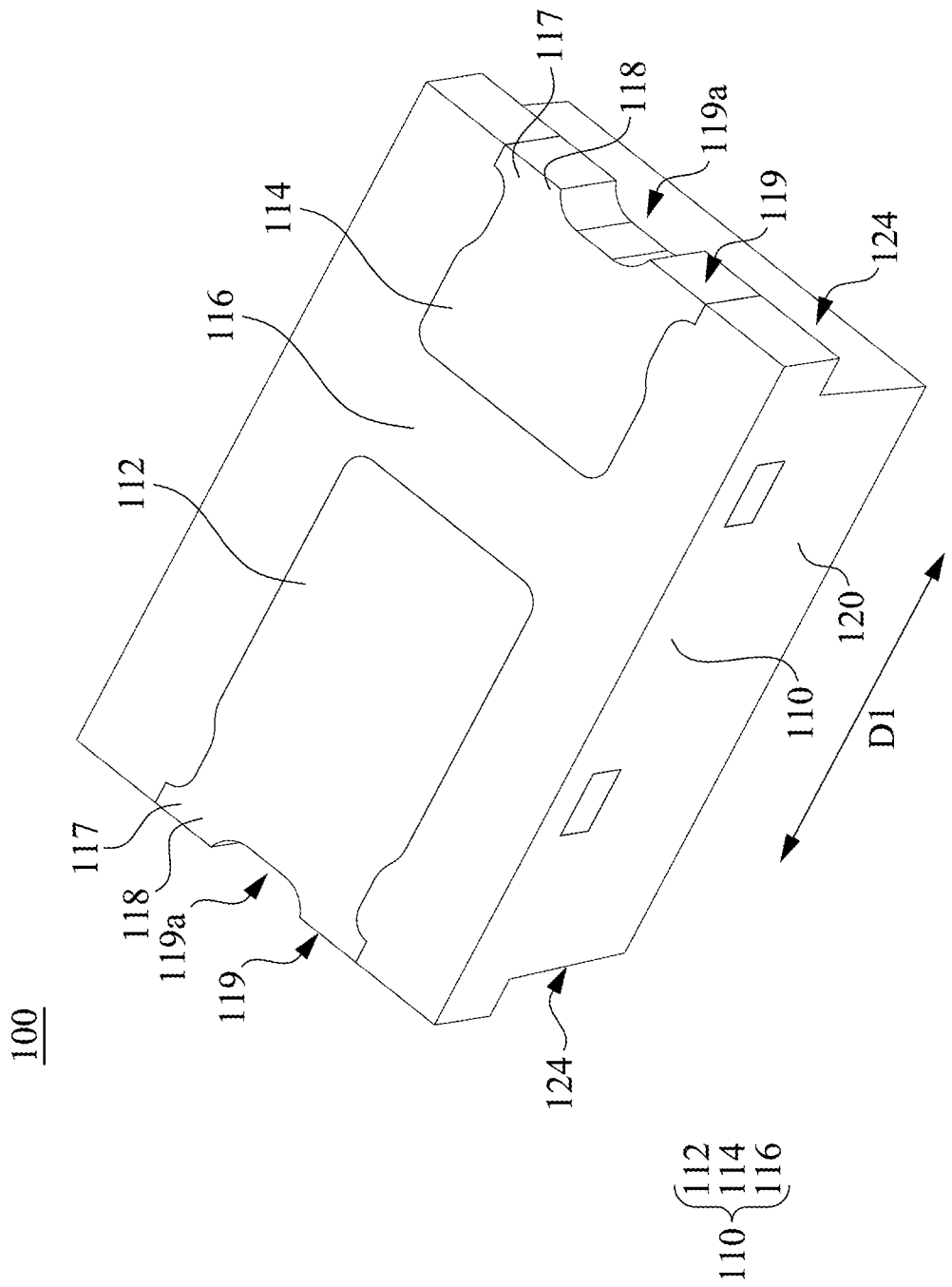
FIG. 2 illustrates a bottom view of the lead frame structure in FIG. 1.
Figure 3:
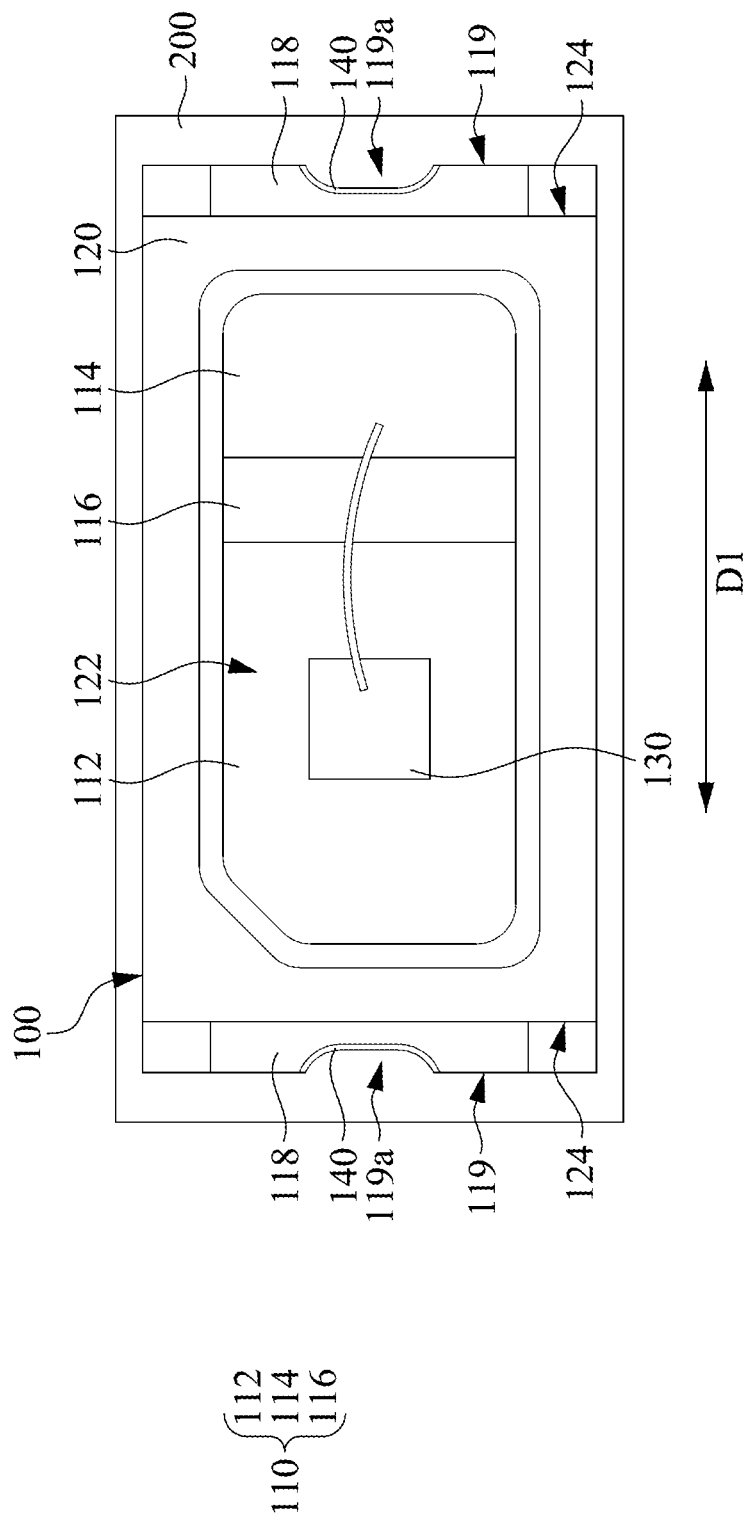
FIG. 3 illustrates a top view of the lead frame structure in FIG. 1 after being pasted by a bonding layer and bonding to a circuit board.

FIG. 2 illustrates a bottom view of the lead frame structure 100 in FIG. 1. FIG. 3 illustrates a top view of the lead frame structure 100 in FIG. 1 after being pasted by a bonding layer 140 and bonding to a circuit board 200. Referring to FIG. 2 and FIG. 3 together, in some embodiments, the bottom surfaces 117 of the extending portions 118 of the first conductive portion 112 and the second conductive portion 114 may be pasted by the bonding layer 140. For example, the bonding layer 140 may be a tin paste, but it is not limited in this regard. After the lead frame structure 100 is pasted by the bonding layer 140 and is bonded to the circuit board 200, the bonding layer 140 may stable the lead frame structure 100 onto the circuit board 200 and may allow the first conductive portion 112 and the second conductive portion 114 of the lead frame structure 100 to be electrically connected to the circuit board 200.

In details, due to the first conductive portion 112 and the second conductive portion 114 of the lead frame structure 100 have the extending portions 118, and the extending portions 118 of the first conductive portion 112 and the second conductive portion 114 extend beyond the external surface 124 of the blocking wall 120 thereon in the horizontal direction D1, after the bonding layer 140 is pasted under the lead frame structure 100 and bonded to the circuit board 200, the squeezed bonding layer 140 may overflow from the concave portion 119a of the extending portions 118, such that the bonding layer 140 is easier to be observed. As a result, an inspector may observe the bonding layer 140 located at the extending portion 118 to ensure that the bonding layer 140 is uniformly filled under the lead frame structure 100, so as to reduce defect of the lead frame structure 100 and improve a yield of the lead frame structure 100, so that the lead frame structure 100 may be applicable in the subsequent packaging process.

It is to be noted that the connection relationship of the aforementioned elements will not be repeated. In the following description, other types of extending portions will be described.

Figure 4:
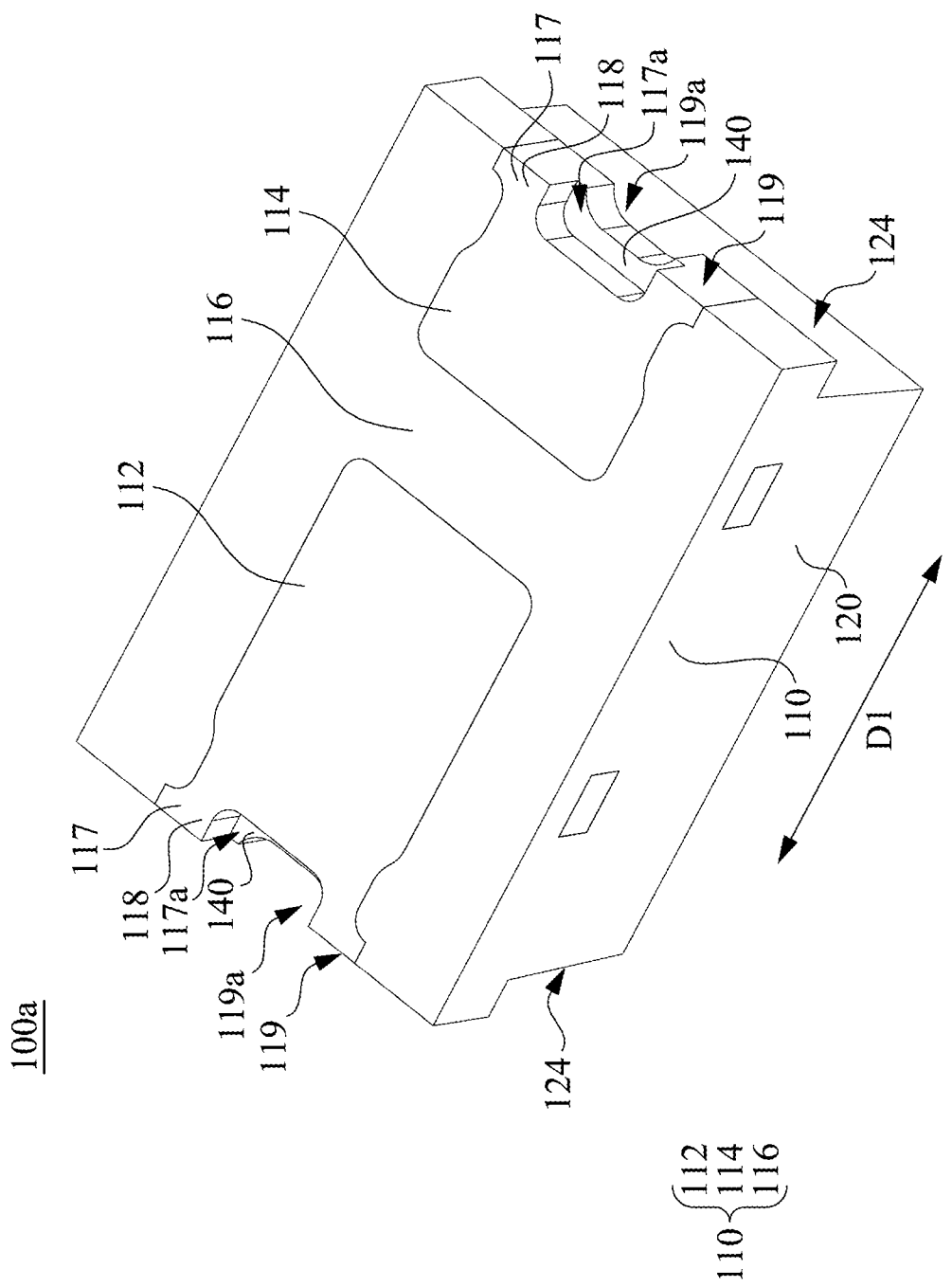
FIG. 4 illustrates a bottom view of a lead frame structure according to another embodiment of the present disclosure.

FIG. 4 illustrates a bottom view of a lead frame structure 100a according to another embodiment of the present disclosure. The lead frame structure 100a includes the bottom board 110 and the blocking wall 120. The bottom board 110 of the lead frame structure 100a has the first conductive portion 112 and the second conductive portion 114. The difference from the embodiment shown in FIG. 2 is that besides the lateral surface 119 of the extending portion 118 has the concave portion 119a, the bottom surfaces 117 of the extending portions 118 of the first conductive portion 112 and the second conductive portion 114 also have a concave portion 117a. In some embodiments, the depth of the concave portion 117a in the horizontal direction D1 is deeper than the concave portion 119a. That is, the concave portion 117a is closer to the insulated portion 116 than the concave portion 119a. The concave portion 117a on the bottom surface 117 of the extending portion 118 may be formed by an etching process. For example, a half thickness of the extending portion 118 may be etched on the bottom surface 117 of the extending portion 118 to form the concave portion 117a. The concave portion 117a of the extending portion 118 has a relatively large accommodating space, so that the bonding layer 140 (see FIG. 3) may be located therein to improve the stability. When the bonding layer 140 is pasted under the lead frame structure 100a, the concave portion 117a of the extending portion 118 may accommodate the more bonding layer 140. Therefore, the concave portion 117a of the extending portion 118 may strengthen and stabilize the positional relationship between the lead frame structure 100a and the circuit board 200 (see FIG. 3).

Figure 5:
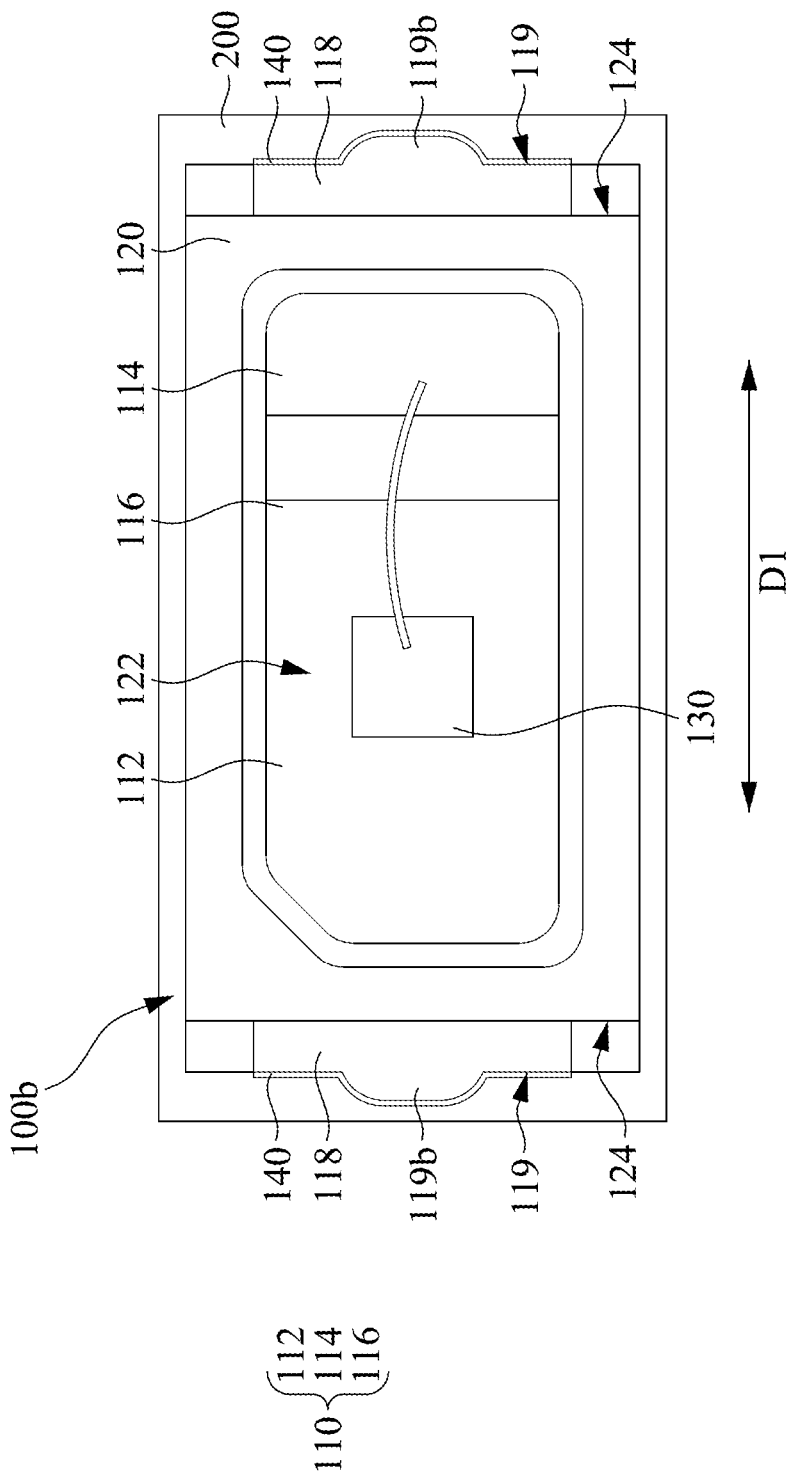
FIG. 5 illustrates a top view of a lead frame structure according to another embodiment of the present disclosure.

FIG. 5 illustrates a top view of a lead frame structure 100b according to another embodiment of the present disclosure. The lead frame structure 100b includes the bottom board 110 and the blocking wall 120. The bottom board 110 of the lead frame structure 100b has the first conductive portion 112 and the second conductive portion 114. The extending portions 118 of the first conductive portion 112 and the second conductive portion 114 have the lateral surface 119 facing away from the blocking wall 120. The difference from the embodiment shown in FIG. 3 is that the lateral surface 119 of the extending portion 118 has a protruding portion 119b. Since the lateral surface 119 of the extending portion 118 has the protruding portion 119b extending beyond the external surface 124 of the blocking wall 120 thereon in the horizontal direction D1, when the bonding layer 140 is pasted under the lead frame structure 100b and the lead frame structure 100b is bonded to the circuit board 200, the squeezed bonding layer 140 may overflow from the lateral surface 119 and the protruding portion 119b of the extending portion 118, such that the bonding layer 140 is easier to be observed. In this way, an inspector may observe the bonding layer 140 located on the extending portion 118 to ensure that the bonding layer 140 is uniformly filled under the lead frame structure 100b, so as to reduce the defect of the lead frame structure 100b and make sure that the lead frame structure 100b may be applicable in the subsequent packaging process.

Figure 6:
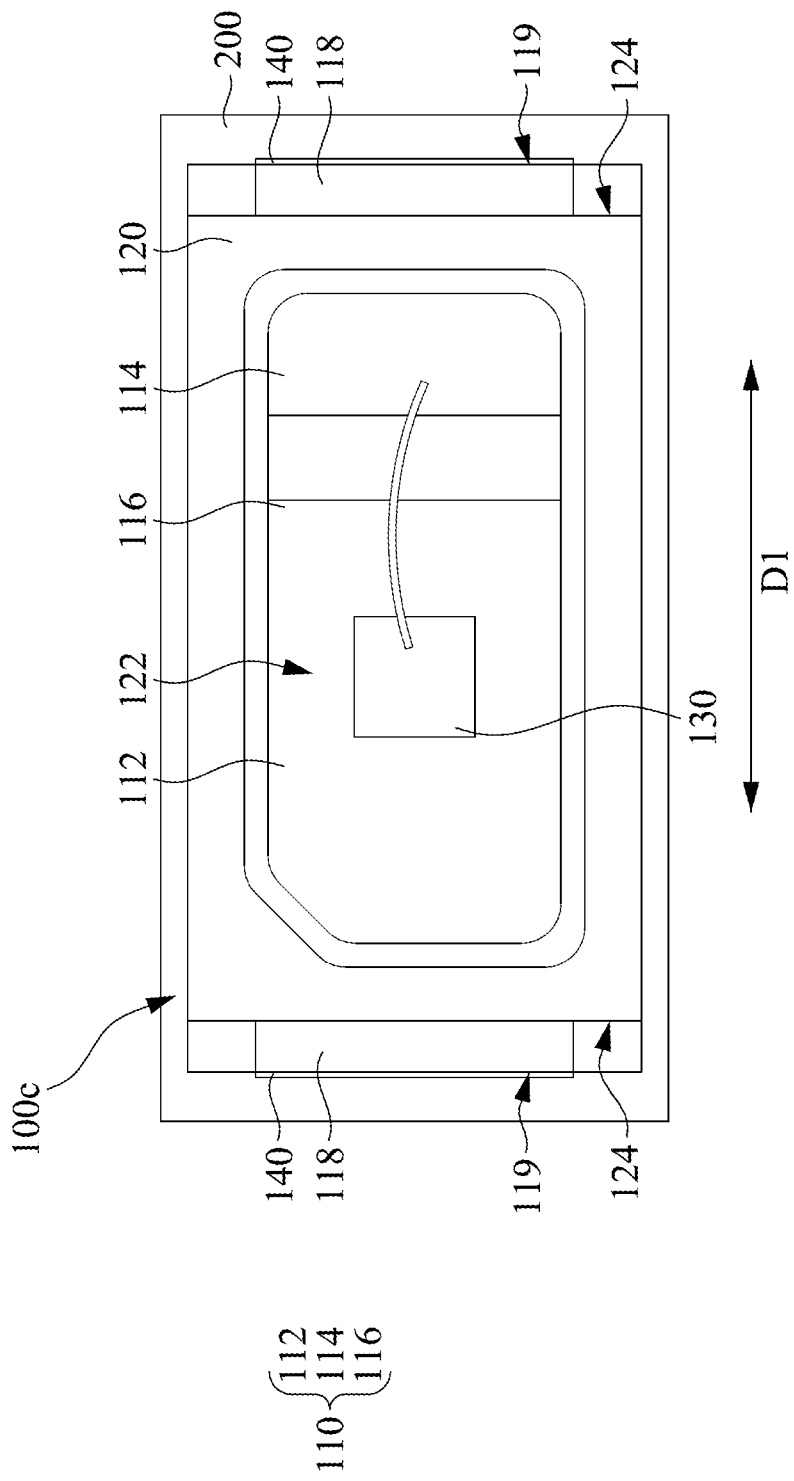
FIG. 6 illustrates a top view of a lead frame structure according to yet another embodiment of the present disclosure.

FIG. 6 illustrates a top view of a lead frame structure 100c according to yet another embodiment of the present disclosure. The lead frame structure 100c includes the bottom board 110 and the blocking wall 120. The bottom board 110 of the lead frame structure 100c has the first conductive portion 112 and the second conductive portion 114. The extending portions 118 of the first conductive portion 112 and the second conductive portion 114 have the lateral surface 119 facing away from the blocking wall 120. The difference from the embodiment shown in FIG. 3 is that the lateral surfaces 119 of the extending portions 118 are flat. Since the lateral surfaces 119 of the extending portions 118 of the first conductive portion 112 and the second conductive portion 114 are flat, when the bonding layer 140 is pasted under the lead frame structure 100c and the lead frame structure 100c is bonded to the circuit board 200, the squeezed bonding layer 140 may overflow from the lateral surface 119 of the extending portion 118, so that the bonding layer 140 is easier to be observed. In this way, an inspector may observe the bonding layer 140 located on the lateral surface 119 of the extending portion 118 to ensure that the bonding layer 140 is uniformly filled under the lead frame structure 100c, so as to reduce the defect of the lead frame structure 100c and make sure that the lead frame structure 100c may be applicable in the subsequent packaging process.

Figure 7:
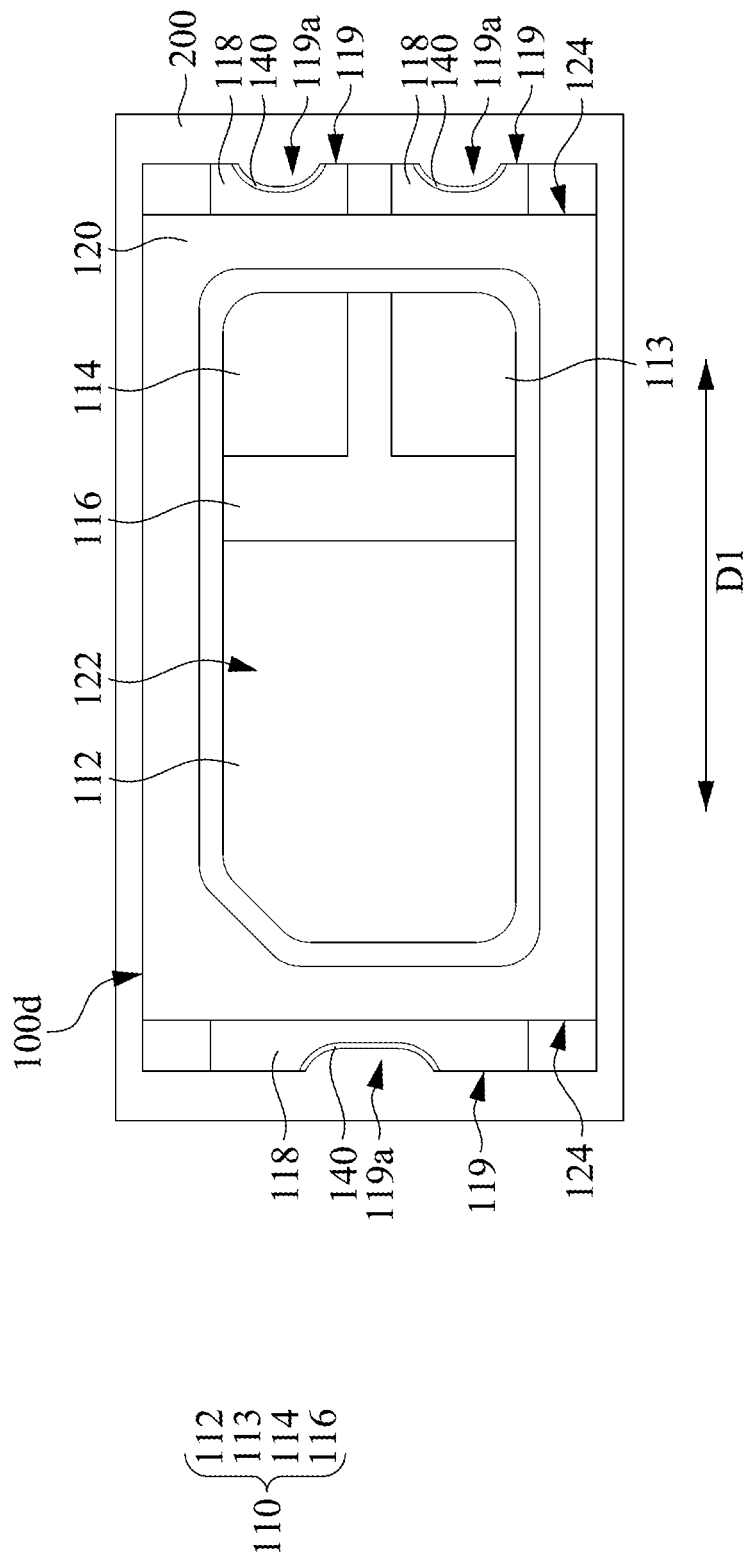
FIG. 7 illustrates a top view of a lead frame structure according to yet another embodiment of the present disclosure.

FIG. 7 illustrates a top view of a lead frame structure 100d according to yet another embodiment of the present disclosure. The lead frame structure 100d includes the bottom board 110 and the blocking wall 120. The bottom board 110 of the lead frame structure 100d has the first conductive portion 112 and the second conductive portion 114. The difference from the embodiment shown in FIG. 3 is that the bottom board 110 of the lead frame structure 100d further has a third conductive portion 113, and the insulated portion 116 of the lead frame structure 100d extends between the second conductive portion 114 and the third conductive portion 113. The third conductive portion 113 of the bottom board 110 has the extending portion 118, and the extending portion 118 of the third conductive portion 113 extends beyond the external surface 124 of the blocking wall 120 in the horizontal direction D1. Also, the insulated portion 116 of the lead frame structure 100d extends between the extending portion 118 of the second conductive portion 114 and the extending portion 118 of the third conductive portion 113 to provide an insulated effect. The extending portions 118 of the first conductive portion 112, the second conductive portion 114 and third conductive portion 113 all have the lateral surface 119 facing away from the blocking wall 120, and the lateral surface 119 of the extending portion 118 has the concave portion 119a.

Figure 8:
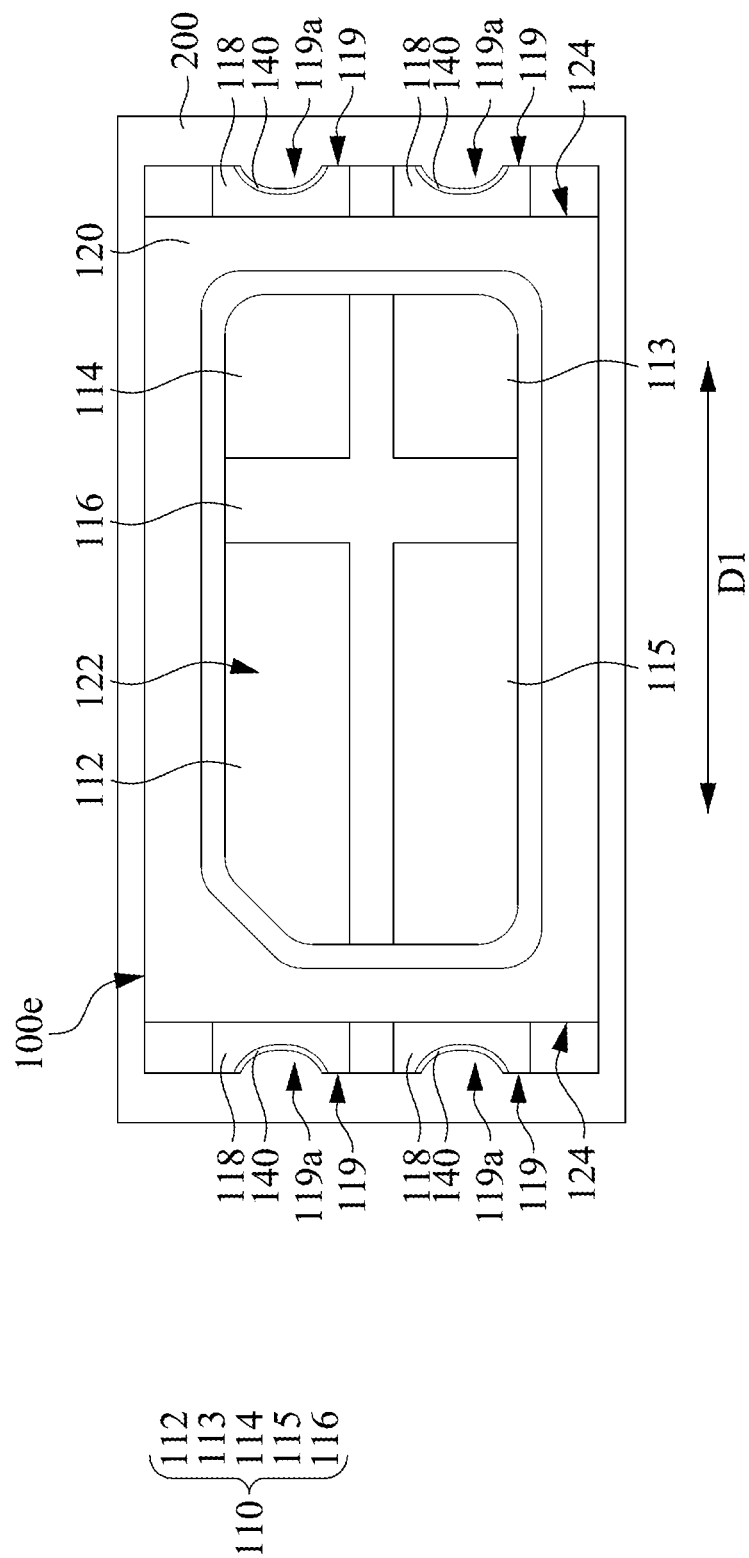
FIG. 8 illustrates a top view of a lead frame structure according to yet another embodiment of the present disclosure.

FIG. 8 illustrates a top view of a lead frame structure 100e according to yet another embodiment of the present disclosure. The lead frame structure 100e includes the bottom board 110 and the blocking wall 120. The bottom board 110 of the lead frame structure 100e has the first conductive portion 112, the second conductive portion 114 and the third conductive portion 113. The difference from the embodiment shown in FIG. 7 is that the bottom board 110 of the lead frame structure 100e further has a fourth conductive portion 115, and the insulated portion 116 of the lead frame structure 100e extends between the first conductive portion 112 and the fourth conductive portion 115. The fourth conductive portion 115 of the bottom board 110 has the extending portion 118, and the extending portion 118 of the fourth conductive portion 115 extends beyond the external surface 124 of the blocking wall 120 in the horizontal direction D1. Also, the insulated portion 116 of the lead frame structure 100e extends between the extending portion 118 of the first conductive portion 112 and the extending portion 118 of the fourth conductive portion 115 to provide an insulated effect. The extending portions 118 of the first conductive portion 112, the second conductive portion 114, the third conductive portion 113 and the fourth conductive portion 115 all have the lateral surface 119 facing away from the blocking wall 120, and the lateral surface 119 of the extending portion 118 has the concave portion 119a.

In the following description, a method of manufacturing the lead frame structure 100 will be described.

Figure 9:
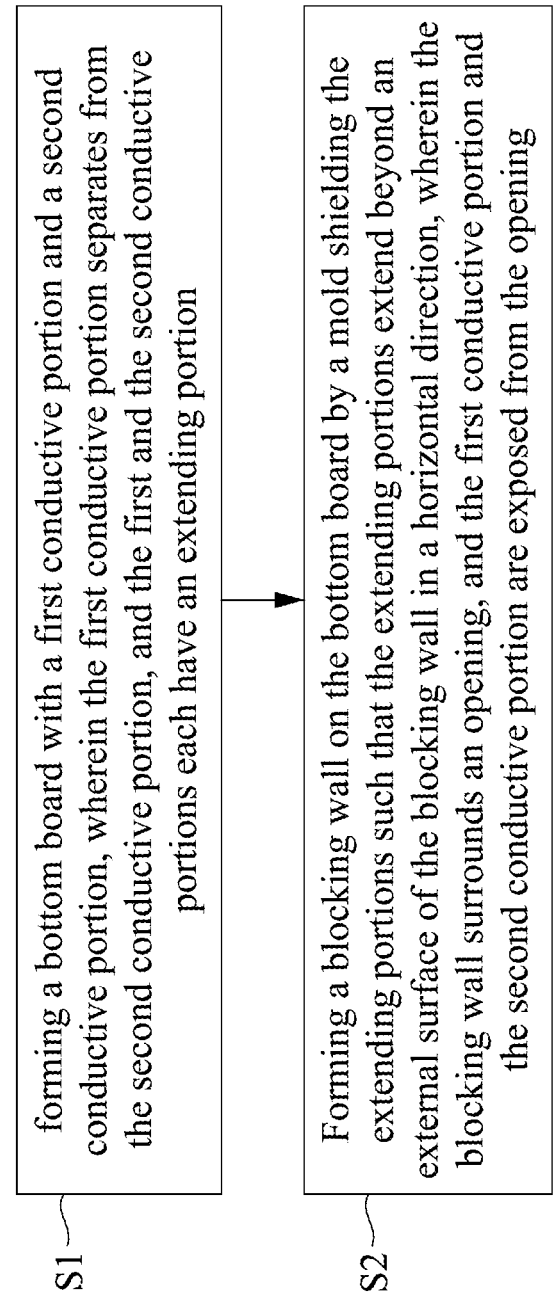
FIG. 9 illustrates a flow chart of a manufacturing method of a lead frame structure according to one embodiment of the present disclosure.

FIG. 9 illustrates a flow chart of a manufacturing method of a lead frame structure according to one embodiment of the present disclosure. The manufacturing method of the lead frame structure includes steps as outlined below. First, in step S1, a bottom board with a first conductive portion and a second conductive portion is formed, wherein the first conductive portion separates from the second conductive portion, and the first and the second conductive portions each have an extending portion. Next, in step S2, a blocking wall is formed on the bottom board by a mold shielding the extending portions such that the extending portions extend beyond an external surface of the blocking wall in a horizontal direction, wherein the blocking wall surrounds an opening, and the first conductive portion and the second conductive portion are exposed from the opening.

In step S1, an insulated portion may be disposed between the first conductive portion and the second conductive portion to separate the first conductive portion and the second conductive portion.

In step S2, a light source may be disposed on the first conductive portion, and the light source may be a light-emitting diode, and the structure shown in FIG. 1 is presented.

In some embodiments, the manufacturing method of the lead frame structure further includes that a bottom surface of the extending portion of the first conductive portion and a bottom surface of the extending portion of the second conductive portion are etched, so that the bottom surface of the extending portion of the first conductive portion and the bottom surface of the extending portion of the second conductive portion each have a concave portion, as shown in FIG. 4. In details, a half thickness of the extending portion 118 may be etched on the bottom surface of the extending portion to form the concave portion. The concave portion located on the bottom surface of the extending portion may be pasted by the bonding layer. The bonding layer may bond the lead frame structure to the circuit board and may stable the lead frame structure onto the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lead frame structure, comprising:
a bottom board with a first conductive portion and a second conductive portion, the first conductive portion separated from the second conductive portion, and the first and the second conductive portions configured to electrically connect to a light source; and
a blocking wall located on the bottom board and surrounding an opening, the first and the second conductive portions exposed from the opening, wherein the first and the second conductive portions each have an extending portion, and the extending portion extends beyond an external surface of the blocking wall in a horizontal direction, the extending portion has a lateral surface facing away from the blocking wall, and the lateral surface has a flat portion and a first concave portion, the flat portion extends from the first concave portion to a lower sidewall of the bottom board, and the flat portion of the lateral surface of the extending portion is coplanar with the lower sidewall of the bottom board, and a bottom surface of the extending portion of the first conductive portion and a bottom surface of the extending portion of the second conductive portion each have a second concave portion, and a depth of the second concave portion is deeper than a depth of the first concave portion in the horizontal direction.

2. The lead frame structure of claim 1, wherein the bottom board has an insulated portion, and the insulated portion is located between the first conductive portion and the second conductive portion.

3. The lead frame structure of claim 1, wherein a bottom surface of the extending portion of the first conductive portion and a bottom surface of the extending portion of the second conductive portion are configured to be pasted by a bonding layer.

4. The lead frame structure of claim 1, wherein the second concave portion of the bottom surface of the extending portion of the first conductive portion and the second concave portion of the bottom surface of the extending portion of the second conductive portion are configured to be pasted by a bonding layer.

5. The lead frame structure of claim 2, wherein the bottom board further has a third conductive portion, and the insulated portion extends between the second conductive portion and the third conductive portion, and the third conductive portion has an extending portion, the extending portion of the third conductive portion extends beyond the external surface of the blocking wall in the horizontal direction.

6. The lead frame structure of claim 5, wherein the bottom board further has a fourth conductive portion, and the insulated portion extends between the first conductive portion and the fourth conductive portion, and the fourth conductive portion has an extending portion, the extending portion of the fourth conductive portion extends beyond the external surface of the blocking wall in the horizontal direction.

7. A manufacturing method of a lead frame structure, comprising:

forming a bottom board with a first conductive portion and a second conductive portion, wherein the first conductive portion separates from the second conductive portion, and the first and the second conductive portions each have an extending portion;

forming a blocking wall on the bottom board by a mold shielding the extending portions such that the extending portions extend beyond an external surface of the blocking wall in a horizontal direction, wherein the blocking wall surrounds an opening, and the first conductive portion and the second conductive portion are exposed from the opening, the extending portion has a lateral surface facing away from the blocking wall, and the lateral surface has a flat portion and a first concave portion, the flat portion extends from the first concave portion to a lower sidewall of the bottom board, and the flat portion of the lateral surface of the extending portion is coplanar with the lower sidewall of the bottom board; and etching a bottom surface of the extending portion of the first conductive portion and a bottom surface of the extending portion of the second conductive portion such that the bottom surface of the extending portion of the first conductive portion and the bottom surface of the extending portion of the second conductive portion each have a second concave portion, wherein a depth of the second concave portion is deeper than a depth of the first concave portion in the horizontal direction.

* * * * *